(12) United States Patent
Morozumi et al.

(10) Patent No.: US 6,844,621 B2
(45) Date of Patent: Jan. 18, 2005

(54) SEMICONDUCTOR DEVICE AND METHOD OF RELAXING THERMAL STRESS (75) Inventors: Akira Morozumi, Nagano (JP); Yoshitaka Nishimura, Nagano (JP); Souichi Okita, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/640,182

(22) Filed: Aug. 13, 2003

(65) Prior Publication Data

US 2004/0102023 A1 May 27, 2004

(30) Foreign Application Priority Data

Aug. 13, 2002 (JP) ........................................ 2002-235888

(51) Int. Cl.[7] .............................................. H01L 23/12
(52) U.S. Cl. ........................ 257/700; 257/701; 257/703; 257/704; 257/710
(58) Field of Search ................................ 257/700, 701, 257/703, 704, 710

(56) References Cited

U.S. PATENT DOCUMENTS

| | | | | |
|---|---|---|---|---|
| 5,291,065 A | * | 3/1994 | Arai et al. | 257/723 |
| 5,424,579 A | * | 6/1995 | Arai et al. | 257/690 |
| 5,721,455 A | * | 2/1998 | Takashita | 257/713 |
| 5,808,358 A | * | 9/1998 | Vinciarelli et al. | 257/700 |
| 6,124,635 A | * | 9/2000 | Kuwabara | 257/703 |
| 6,388,316 B1 | * | 5/2002 | Matsumoto | 257/700 |
| 6,421,244 B1 | * | 7/2002 | Shinohara et al. | 361/736 |
| 6,509,643 B2 | * | 1/2003 | Ohtaka et al. | 257/712 |
| 6,605,868 B2 | * | 8/2003 | Ishiwata et al. | 257/703 |

FOREIGN PATENT DOCUMENTS

| | | |
|---|---|---|
| JP | 10-270612 | 10/1998 |
| JP | 2001-160659 | 6/2001 |
| JP | 2002-076256 | 3/2002 |

* cited by examiner

Primary Examiner—Jasmine Clark
(74) Attorney, Agent, or Firm—Rossi & Associates (57) ABSTRACT A semiconductor device has an insulating substrate with conductor patterns bonded to and formed on both the top and bottom surfaces of a ceramic substrate. Soldering is provided between the conductor pattern on the top surface side and a heat developing chip component such as a power semiconductor element is mounted thereon. Between the conductor pattern on the bottom surface side and a heat dissipating metal base plate, each of four corners of the ceramic substrate is chamfered to form a chamfered section with a chamfered dimension of 2 to 10 mm. Alternatively, slits can be formed at the four corners on the bottom surface side. Moreover, the thickness of the conductor patterns can be controlled in relation to the ceramic substrate. These configurations relax the stress concentration created in the soldered section due to a thermal cycle.

13 Claims, 9 Drawing Sheets

SEMICONDUCTOR DEVICE AND METHOD OF RELAXING THERMAL STRESS

BACKGROUND

Figure 10:
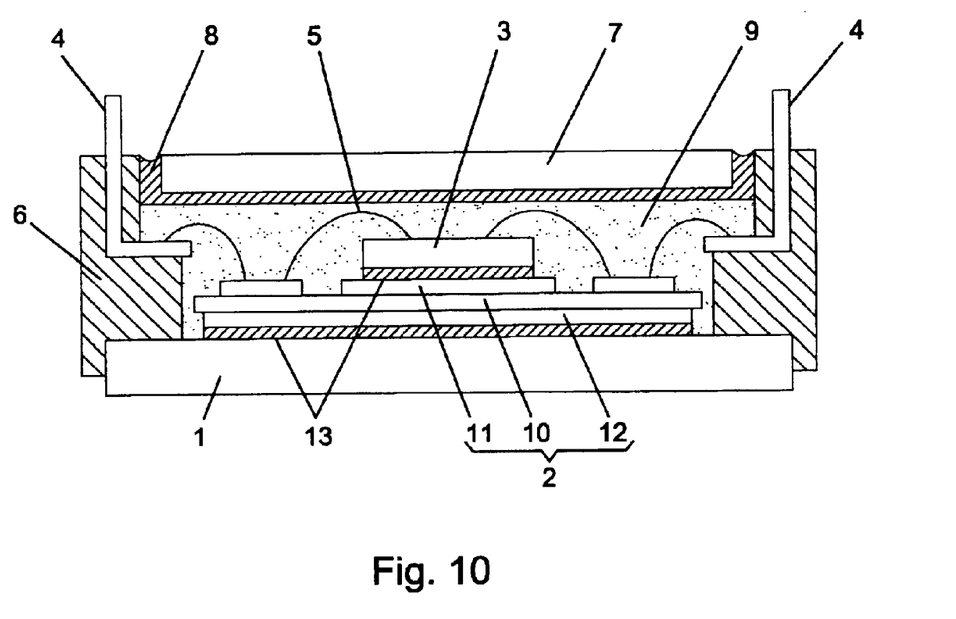
FIG. 10 is a view showing a structure of an assembled power semiconductor module to which an insulating substrate according to the invention can be applied.
Figure 11:
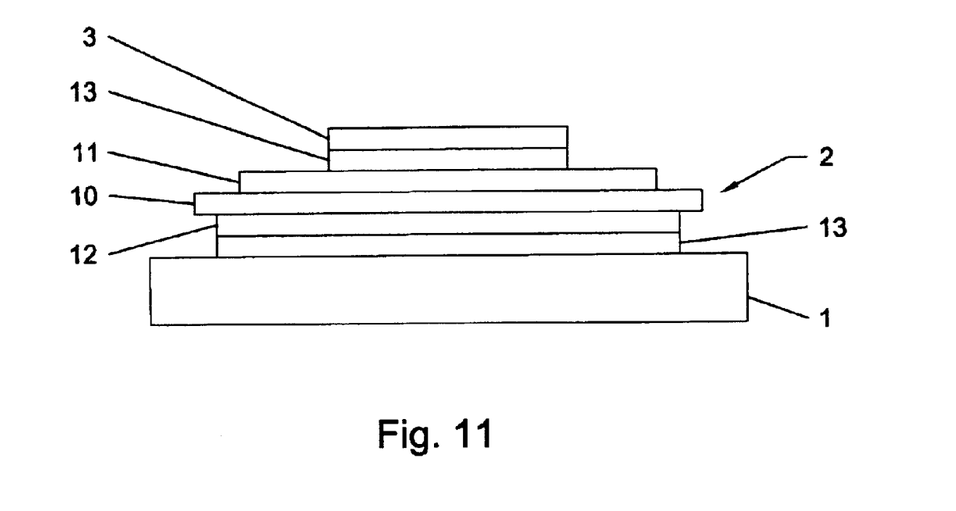
FIG. 11 is a view schematically showing a structure of a principal part of the module shown in FIG. 10.

An assembled power semiconductor module is shown in FIGS. 10 and 11, where reference numeral 1 denotes a metal base (for example, a copper plate) for heat dissipation, numeral 2 denotes an insulating substrate mounted on the metal base 1, and numeral 3 denotes a heat developing chip component such as a power semiconductor element (hereinafter referred to as "a silicon chip"), which is mounted on an upper surface of the insulating substrate 2. The metal base 1 can be a plate-like metal or a metal provided with a heat radiation fin. When the plate-like metal is used, the heat radiation fin can be joined thereto.

The power semiconductor element is referred to as an IGBT or FWD (Free Wheeling Diode). Reference numeral 4 denotes an external terminal for a main circuit formed in the above power semiconductor element and associated components, numeral 5 denotes a bonding wire, numeral 6 denotes an outer resin case, numeral 7 denotes a top cover, numeral 8 denotes a sealing resin and numeral 9 denotes a gel filler.

Here, the insulating substrate 2 has a structure in which conductor patterns 11 and 12 of copper or aluminum foils are bonded onto both the top and bottom surfaces of the square ceramic substrate 10, respectively. The bonding is carried out by a direct bonding method or an active metal bonding method. With the conductor pattern 11 on the top surface side of the insulating substrate 2 taken as a circuit pattern, the silicon chip 3 is mounted onto the conductor pattern 11 by soldering. Soldering is also provided between the conductor pattern 12 on the bottom surface side of the insulating substrate 2 and the metal base 1. This way, thermal junctions are provided between the silicon chip 3 and the metal base 1. Reference numeral 13 denotes a solder layer of each of soldered sections (see, for example, page 1 of JP-A-10-270612).

Moreover, as will be described later, it is known to mount an IGBT on an insulating substrate to prevent or reduce development of crack, which is induced in the soldered section due to thermal stress applied thereto (see, for example, paragraph 0029 and FIG. 3 of JP-A-2002-76256).

The above-described power semiconductor module needs to reliably operate for a long-term with severity of a service environment and change in an operating temperature. However, a principal part of the above-described power semiconductor module is provided as a layered structure in which component materials each having a different coefficient of thermal expansion are soldered to one another. This causes a severe thermal stress to be applied to each of soldered sections due to a temperature cycle attributed to the service environment of the power semiconductor module and heat developed in the silicon chip 3 associated with an actual operation of the module. In this case, solder is liable to be affected by thermal stress because the melting point thereof is below 300° C. or less, compared with those of other component materials, such as the insulating substrate 2. Therefore, the fatigue life of the soldered section largely affects the reliability and the life of the entire power semiconductor module.

Figure 12:
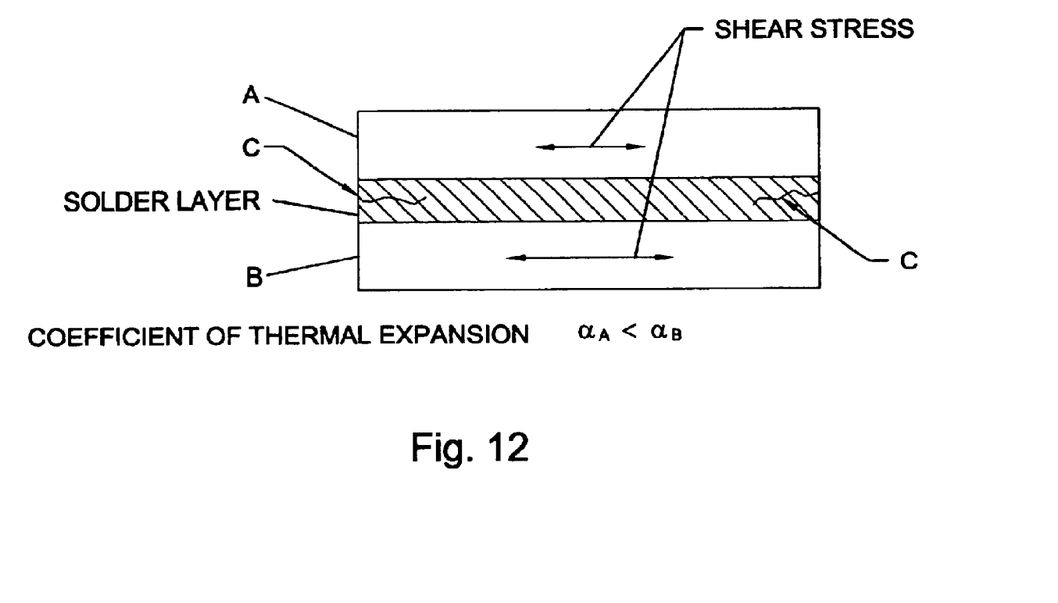
FIG. 12 is an explanatory view showing solder cracks developed in a solder layer providing a joint between component materials to be joined having coefficients of thermal expansion different from each other.
Figure 13:
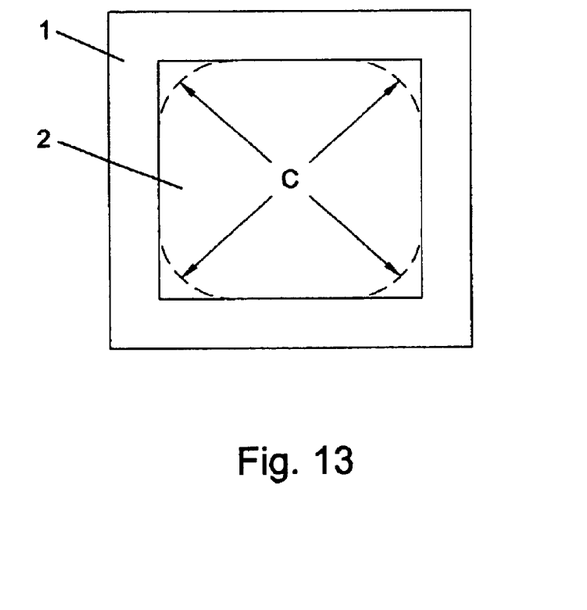
FIG. 13 is a view showing a development distribution of solder cracks in the soldered section in the insulating substrate shown in FIG. 11.

Namely, as presented in FIG. 12, in a solder layer providing a junction between a material A to be joined (coefficient of thermal expansion $\alpha_A$) and a material B to be joined (coefficient of thermal expansion $\alpha_B$), thermal stress is created by the difference in the coefficient of thermal expansion between the materials A and B to be joined, which causes shear strain. The shear strain reaching a region of plastic deformation causes the solder to be subjected to plastic deformation. This is repeated by the temperature cycle to develop solder cracks C over time. The developed solder cracks C further propagates gradually. In this case, in the structure of the module assembled as shown in FIG. 11, the insulating substrate 2 soldered to the metal base 1 square. Therefore, thermal stress, applied to soldered section due to a temperature cycle, concentrates at each of four corners of the insulating substrate 2, where an amount of thermal expansion or contraction becomes maximum as shown in FIG. 13. This causes in the soldered section the solder crack C to develop with each of the four corners of the insulating substrate 2 as a starting point. The solder crack C gradually grows toward the center of the insulating substrate 2 from each of the four corners with repetition of the temperature cycle.

Moreover, when the solder crack C, developed at the corner of the insulating substrate 2, grows to a joint face region with the silicon chip 3 (see FIG. 11) mounted on the substrate, the solder cracks C prevent heat transfer from the insulating substrate 2 to the metal base 1 for proper heat dissipation. This interrupts heat dissipation from the silicon chip 3, raising the junction temperature of the semiconductor element, which will lead to possible thermal breakdown.

Moreover, in a semiconductor device assembled by adopting the insulating substrate 2 made of ceramic, there is a larger difference in coefficient of thermal expansion between the insulating substrate 2 and the metal base 1 compared with the difference in coefficient of thermal expansion between the silicon chip 3 and the insulating substrate 2. In addition, the soldered section between the insulating substrate 2 and the metal base 1 has a larger joint area compared with that of the soldered section between the insulating substrate 2 and the silicon chip 3. This increases the amount of strain induced at the soldered section between the insulating substrate 2 and the metal base 1 due to repetition of the temperature cycle. Therefore, the solder cracks C in the soldered section develops in a shorter period while increasing the propagating period of the solder cracks C. The above JP-A-2002-76256 discloses suppressing cracks induced in the soldered section.

In this regard, in a semiconductor module using a substrate of ceramic such as aluminum nitride, the metal base 1 has been made of a material with a lower coefficient of thermal expansion than that of copper (coefficient of thermal expansion of 16.5 ppm/K) to lessen the difference in coefficient of thermal expansion between the insulating substrate 2 and the metal base 1 for the purpose of relaxing thermal stress applied to the soldered section. Specifically, a composite material of aluminum and silicon carbide (coefficient of thermal expansion of 7 ppm/K), a composite material of copper and molybdenum (coefficient of thermal expansion of 7 to 8 ppm/K), or molybdenum (coefficient of thermal expansion of 5 ppm/K), has been used to form the metal base 1.

The above materials with low thermal expansion, however, have about 50% less thermal conductivity (thermal conductivity of 398 W/mK, as opposed to 180 to 210 W/mK). Thus, the materials have inferior heat dissipation performance as substrates. Furthermore, these materials with low thermal expansion, being manufactured by using such a special method as to sinter or impregnate SiC or Mo having a high melting point and being hard to be machined, are expensive compared with copper material. This increases the cost of the semiconductor module.

Moreover, as another solution for lessening the stress applied to the soldered section, the thickness of the solder layer between the insulating substrate 2 and the metal base 1 is increased to lessen thermal stress created in the soldered section. Although this method is effective for extending the life of the soldered section, however, the thermal resistance at the joined section increases with the increasing thickness, lowering the heat dissipation. Furthermore, increasing the thickness of the soldered section increases the amount of solder being used to produce solder balls or cause a solder overflow in a module assembling process (a soldering process), lowering the product yield. Further, it is technically difficult to uniformly maintain the thickness of the solder layer.

Accordingly, there still remains a need to improve the life of a semiconductor device by suppressing the development of solder crack. The present invention addresses this need.

SUMMARY OF THE INVENTION

The present invention relates to a semiconductor device with a power semiconductor element mounted on an insulating substrate and a method of relaxing thermal stress concentration thereof.

One aspect of the present invention is a semiconductor device, which has an insulating substrate comprising a square ceramic substrate, a top conductor pattern formed on and bonded to a top surface of the ceramic substrate, and a bottom conductor pattern formed on and bonded to a bottom surface of the ceramic substrate. The device has a heat developing semiconductor component mounted on the top conductor pattern and a metal base mounted in contact with the bottom conductor pattern. The top conductor pattern and the heat developing semiconductor component are joined with a solder, are the bottom conductor pattern and the metal base.

According to the present invention, the insulating substrate has means for relaxing thermal stress concentration created in the solder due to thermal cycling.

The thermal stress concentration relaxing means can comprise a chamfer at each of four corners of the ceramic substrate, with a chamfered dimension ranging from 2 mm to 10 mm, the chamfered dimension being a distance along a side thereof from a corner thereof to a chamfered part on the side thereof.

The thermal stress concentration relaxing means can comprise four chamfers at the bottom conductor pattern, one at each of four corners thereof, with a chamfered dimension ranging from 2 mm to 10 mm, the chamfered dimension being a distance along a side of the bottom conductor pattern from a corner thereof to a chamfered part on the side thereof.

The thermal stress concentration relaxing means can comprise four slits formed across the bottom conductor pattern, one at each of four corners thereof. Each of the slits can be provided from a position on a side of the bottom conductor pattern at a distance ranging from 2 mm to 10 mm from a respective corner thereof. The width of the slit can range from 0.5 mm to 2.1 mm.

The thermal stress concentration relaxing means can comprise each of the top and bottom conductor patterns having a larger thickness than the ceramic substrate. The ceramic substrate can have a thickness ranging from 0.2 mm to 0.4 mm, and each of the top and bottom conductor patterns can have a thickness ranging from 0.4 mm to 0.6 mm.

The thermal stress concentration relaxing means can include a combination of two or more of the various relaxing means described above.

Another aspect of the present invention is a method of relaxing thermal stress concentration in the semiconductor device described above. The method comprises 1) chamfering at each of four corners of the ceramic substrate, with a chamfered dimension ranging from 2 mm to 10 mm, the chamfered dimension being a distance along a side thereof from a corner thereof to a chamfered part on the side thereof; 2) chamfering four chamfers at the bottom conductor pattern, one at each of four corners thereof, with a chamfered dimension ranging from 2 mm to 10 mm, the chamfered dimension being a distance along a side of the bottom conductor pattern from a corner thereof to a chamfered part on the side thereof; 3) forming four slits formed across the bottom conductor pattern, one at each of four corners thereof; or 4) forming each of the top and bottom conductor patterns with a larger thickness than the ceramic substrate, and then mounting the metal base on the bottom conductor pattern.

DETAILED DESCRIPTION

In the drawings, components corresponding to those shown in FIG. 11 are denoted with the same reference numerals. The insulation substrate 2 according to the present invention includes means for relaxing thermal stress applied to soldered sections. The following embodiments disclose the means for relaxing thermal stress.

Figure 1A:
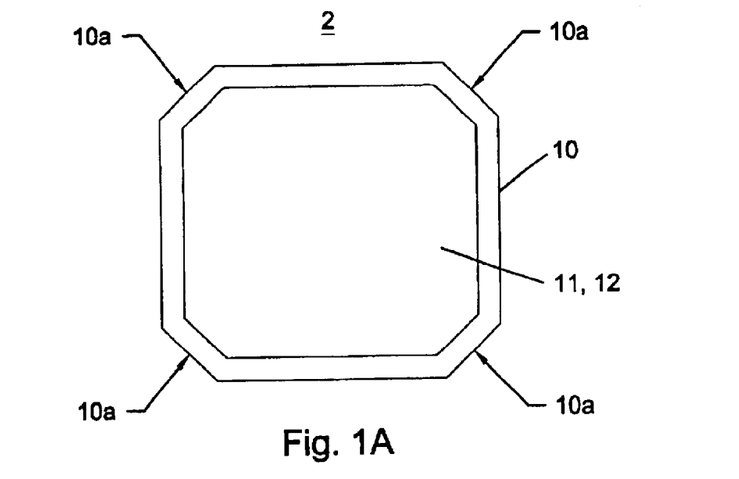
FIG. 1A is a plan view showing a structure of the insulating substrate of an embodiment according to the present invention.
Figure 1B:
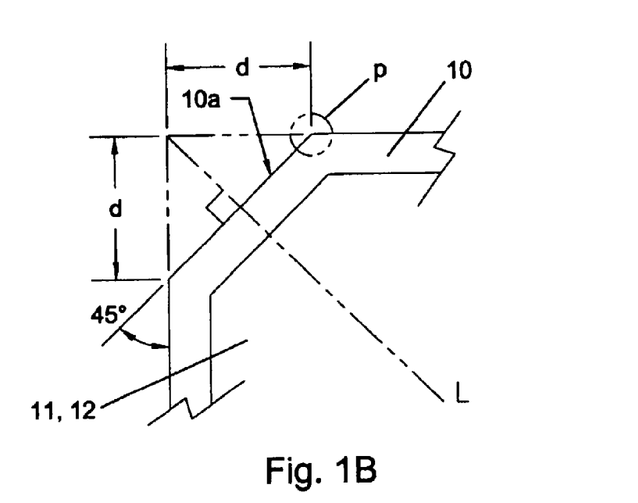
FIG. 1B is an enlarged view showing a corner section of the insulating substrate shown in FIG. 1A.
Figure 1C:
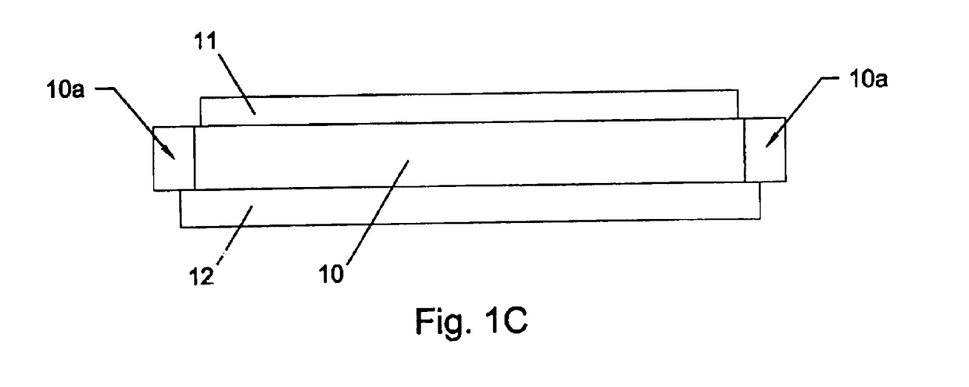
FIG. 1C is a side view of the insulating substrate shown in FIG. 1A.

Referring to FIGS. 1A to 1C, which show a first embodiment according to the present invention, the insulation substrate 2 comprises a square ceramic substrate 10 with bonding conductor patterns 11 and 12 formed on the top and bottom surfaces of the ceramic substrate 10. The bonding is carried out by a direct bonding method or an active metal bonding method. Here, the ceramic substrate 10 can be made of a composite material of aluminum oxide with zirconium oxide added thereto, such as described in Japanese Patent Nos. 2,883,787 and 3,176,815. The size thereof, for example, can be 0.25 mm in plate thickness and 40 mm by 40 mm in outer dimensions. Each of the conductor patterns 11 and 12 formed on and bonded to both the top and bottom surfaces of the ceramic substrate 10, respectively, can be a copper foil also with a thickness of, for example, 0.25 mm. The copper foils can be bonded before being formed into specified patterns by etching. Alternatively, copper foils can be patterned into specified forms before bonding onto the ceramic substrate 10. The composition of the ceramic substrate and the method of forming the conductor patterns are the same in other embodiments described later.

According to the embodiment illustrated in FIGS. 1A–1C, the four corners of the ceramic substrate 10 are chamfered as shown in FIGS. 1A and 1B to form chamfered sections 10a. The ceramic substrate 10 can be formed by sintering a ceramic plate with a size allowing the plate to provide a plurality of substrates each with a desired size before cutting the ceramic plate to obtain a number of the ceramic substrates 10 each with the desired size. Alternatively, substrates of a desired size can be die-punched one by one with each being in a state before sintering called as a green sheet, and thereafter sintering to form into ceramic substrates. When the ceramic plate 10 with the desired size is cut off from the ceramic plate after being sintered, chamfering work of the chamfered section 10a can be simultaneously carried out in the cutting process of the substrates. With such a method of chamfering work by the cutting, a highly accurate finished dimension can be obtained.

Moreover, the shape of the chamfered section 10a is not limited to be linear, but can be cut into circular-arc-like, for example. For securing high accuracy, the chamfered section 10a is linear as illustrated. While, in the case of die-punching the substrate one by one in a state of the green sheet for being sintered, a substrate punching die can be selected for chamfering with an arbitrary shape. For example, the chamfered section 10a can be linear chamfering or circular-arc-like chamfering, or linear chamfering with each corner, portions P in FIG. 1B, at an intersection of a chamfered line and a side of the ceramic plate rounded. For the shape of the chamfered section, the latter method provides a higher degree of flexibility.

The conductor patterns 11 and 12 bonded onto the top and bottom surfaces of the ceramic substrate 10, respectively, are formed as follows. First, the conductor pattern 12 (joined to the metal base) formed on the bottom surface side of the ceramic substrate 10 is formed in a region slightly set back inward from the outer peripheral edge of the ceramic substrate 10. Moreover, to form the conductor pattern 12 along the chamfered section 10a of the ceramic substrate 10, in the illustrated embodiment, the conductor pattern 12 is also chamfered at each of the four corner sections. Compared with this, the conductor pattern 11 formed on the top surface side of the ceramic substrate 10 is shaped into a circuit pattern adapted for connection to the silicon chip and other electronic components mounted on the substrate, and external terminals.

Referring to FIG. 1B, the shape of the chamfered section 10a formed at each of the four corners of the ceramic substrate 10 is determined as follows. Namely, in the illustrated embodiment, linear chamfering work is carried out about the ceramic substrate 10 in the direction perpendicular to a diagonal L (represented by an additional line) to form the chamfered section 10a. In this case, a chamfered dimension d (distance along the side of the ceramic substrate 10 from a corner section of the ceramic substrate 10 before being subjected to the chamfering work to a chamfered part on the side) is determined to be in a range from 2 to 10 mm. The determination is made on the basis of experiments and studies carried out by the inventors so that an effect of relaxing thermal stress applied to soldered sections can be sufficiently exhibited. The shape of the chamfered section 10a, besides being linear as in the illustrated example, can be a circular-arc-like (with a radius of the order of 10 to 20 mm). Furthermore, an encircled section represented by the reference character P in FIG. 1B (a section at which the linear chamfered section 10a and a side of the ceramic substrate 10 intersect with each other) can be rounded.

In the illustrated example, on the assumption that the basic shape of the ceramic substrate 10 is a square, the linear chamfered section 10a is formed in the direction perpendicular to a diagonal L of the square. Compared with this, when the chamfered section 10a is formed in a rectangular ceramic substrate, with the chamfered dimension d of the above condition determined at each of four corner sections, chamfering work can be carried out at an angle of 45° to the side. Further, when a chamfered section is formed in a shape different from being linear, for example, in a circular-arc-like shape, an additional line at an angle of 45° to the side of the substrate is assumed to be drawn from each of the four corners of the ceramic substrate 10. With the additional line thus assumed, a perpendicular line to the additional line is drawn at a point of intersection of the additional line and the chamfered section 10a. With the perpendicular line drawn to intersect an extended line of the side of the substrate, the distance from the point of intersection to the corner of the substrate can be defined as the chamfered dimension d.

Next, an explanation will be made about a temperature cycle test carried out by the inventors in which an insulating substrate with the four corners of the ceramic substrate 10 chamfered as the above embodiment and a related insulating substrate without being chamfered were prepared as test examples. Namely, with each of the above two kinds of insulating substrates (test examples) mounted on a metal base of copper plate with a thickness of 4 mm, solder joint with SnPb solder was provided between the conductor pattern formed on the bottom surface side of the substrate and the metal base. The temperature cycle test for the examples was carried out under a temperature condition from −40° C. to 125° C.

According to the results of the temperature cycle test, in the related substrate without chamfers formed at corner sections of the ceramic substrate 10, the solder crack C illustrated in FIG. 12 was developed in the soldered section at about 2000 cycles. Moreover, it was observed that the solder crack C was initially developed at the corner sections of the substrate where thermal stress is concentrated.

Compared with this, in the insulating substrate with chamfering carried out at each of the four corners of the ceramic substrate 10 with a chamfered dimension d taken as 3.5 mm, the number of temperature cycles for a time to development of solder crack by the temperature cycle test was on the order of 5000 cycles. Moreover, it was observed that the chamfered dimension d taken as 7.0 mm extended the number of cycles to the development of the crack to 6000 cycles.

About each of the test examples, the inventors examined thermal stress applied to the soldered section in the temperature cycle test. According to the examination, with the degree of stress concentration applied to the soldered section of the insulating substrate without the corner chamfers (related substrate) taken as 100, in a substrate chamfered at each of four corners thereof with a chamfered dimension d taken as 3.5 mm, the degree of stress concentration in the soldered section reduced to 73. Furthermore, with the chamfered dimension d increased to 7.0 mm and 10 mm, the degree of stress concentration reduced to 72 and 71, respectively, depending on an increase in the chamfered dimension. From the results of the measurements, it was recognized that chamfering the four corners of the ceramic substrate relaxes stress concentration applied to each corner of the soldered section to extend the fatigue life of the soldered section.

A similar temperature cycle test to the above was also carried out about an insulating substrate with chamfered dimension d of the ceramic substrate larger than 10 mm. However, there was observed no such remarkable improvement in a time to development of solder crack as to exceed the above-described value. This proves that by forming the chamfered section 10a with chamfered dimensions determined in a range from 2 to 10 mm at each of the four corners of the ceramic substrate 10, the fatigue life of the soldered section can be extended to improve the reliability of a power semiconductor module. By taking into consideration that an increase in the chamfered dimension d of the ceramic substrate 10 reduces an effective heat transfer area of the insulating substrate 2 by an amount corresponding to the increase, the practical chamfered dimension d is preferably set to be 7.0 mm or less.

Figure 2:
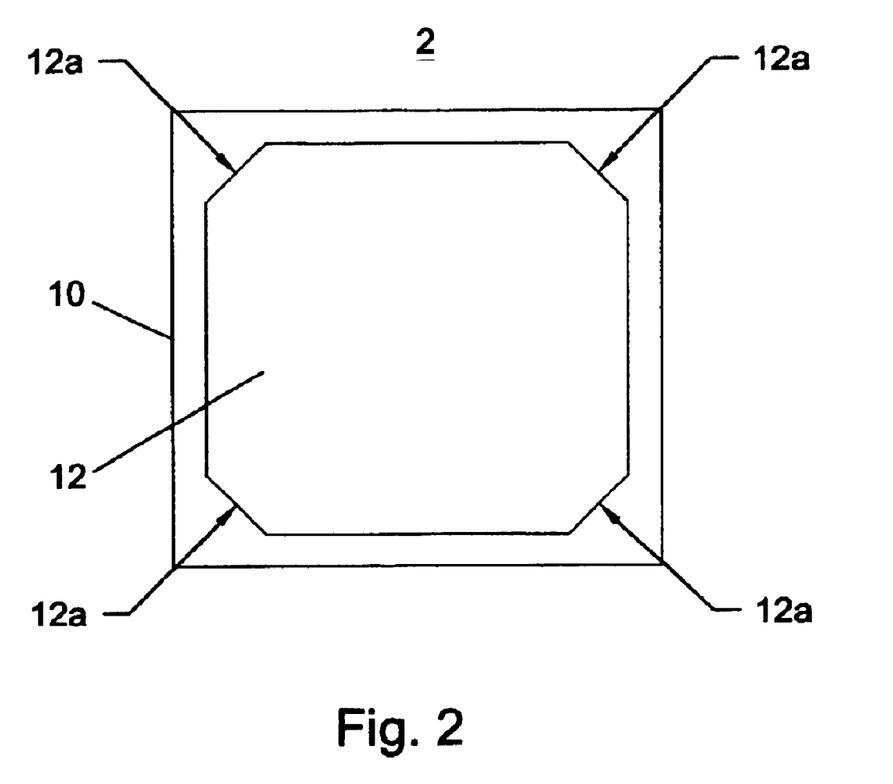
FIG. 2 is a plan view showing a bottom surface side of an insulating substrate of another embodiment according to the present invention.

Referring to FIG. 2, which illustrates another embodiment according to the present invention, the insulating substrate 2 with conductor patterns 11 and 12 formed on both the top and bottom surfaces of a square ceramic substrate 10, respectively, is arranged as follows. The ceramic substrate 10 retains its original square shape. In this embodiment, the ceramic substrate 10 can be formed either by cutting a ceramic plate, sintered with a size allowing the plate to provide a plurality of substrates each with the above-explained desired size, to obtain a number of the ceramic substrates or die-punching the substrate into a desired size before being sintered, as previously explained.

At least the conductor pattern 12, formed on the bottom surface side of the substrate to be soldered to the metal base, can have a chamfered section 12a formed at each of the four corners with a chamfered dimension d determined to be in the range from 2 to 10 mm. By carrying out chamfering, thermal stress created in the soldered section between the metal base and the conductor pattern can be relaxed. The conductor pattern 11 formed on the top surface side of the ceramic substrate 10 can be shaped to mount a component such as the silicon chip and for wire bonding with the external terminals.

According to the arrangement, the chamfered section 12a formed in the conductor pattern 12 functions similarly to the chamfered section in the previous embodiment to relax thermal stress applied to the soldered section between the metal base 1 and the conductor pattern 12a. Evaluation of the insulation substrate of the embodiment of FIG. 2, similar to the previous embodiment, revealed that the fatigue life of the soldered section is increased.

Figure 3A:
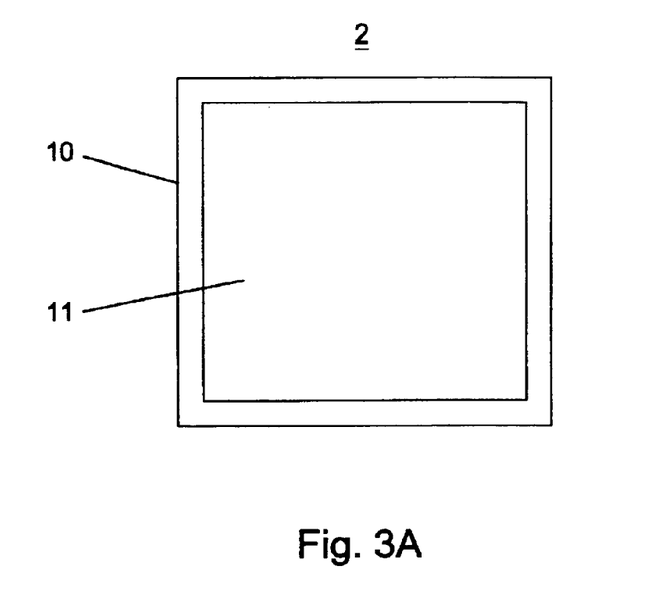
FIG. 3A is a plan view showing an arrangement on a top surface side of an insulating substrate of yet another embodiment according to the present invention.
Figure 3B:
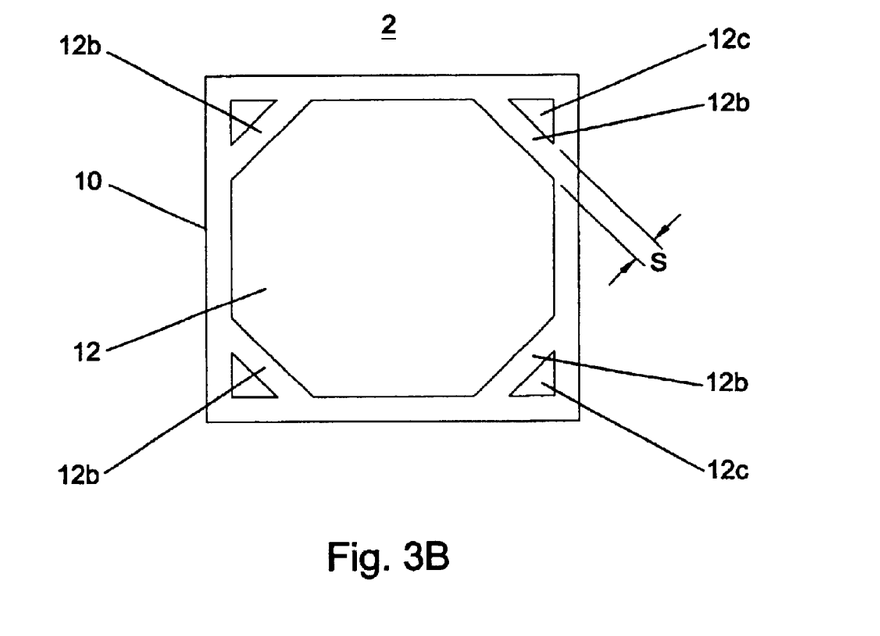
FIG. 3B is a plan view showing an arrangement on a bottom surface side of the insulating substrate of the embodiment of FIG. 3A.
Figure 4:
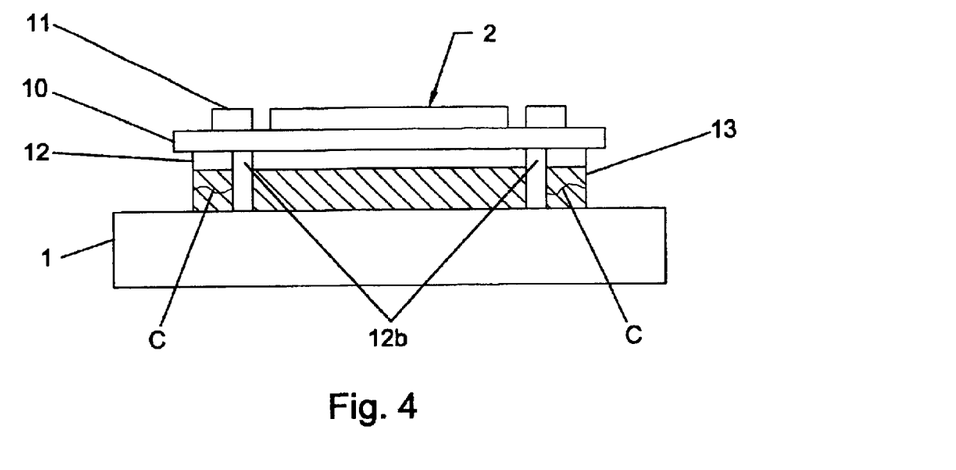
FIG. 4 is a side view showing an assembled state with the insulating substrate shown in FIGS. 3A and 3B being soldered onto a heat dissipating metal base.
Figure 5:
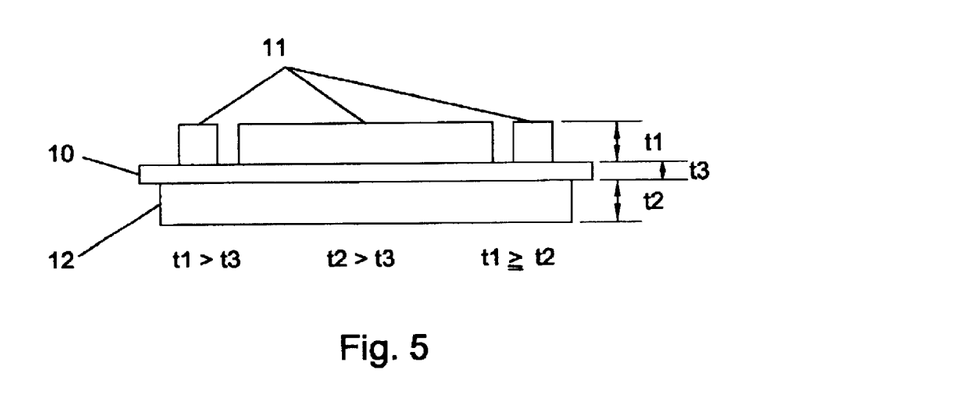
FIG. 5 is a side view showing an insulating substrate of yet another embodiment according to the present invention.

Referring to FIGS. 3A, 3B, and 4, which illustrates yet another embodiment according to the present invention, the insulating substrate 2 with conductor patterns 11 and 12 formed on both the top and bottom surfaces of a square ceramic substrate 10, respectively, is arranged as follows. Like the previous embodiment, the ceramic substrate 10 retains its original square shape. In the embodiment, like the previous embodiments, the ceramic substrate 10 can be obtained by either cutting a ceramic plate, sintered with a size allowing the plate to provide a plurality of substrates each with the above-explained desired size, to a number of the ceramic substrates or die-punching the substrate into a desired size before being sintered.

The conductor pattern 12 on the bottom surface side to be soldered to the metal base 1 for heat dissipation (see FIG. 11) has, at each of the four corners thereof, a linear slit 12b formed perpendicularly to a diagonal of the conductor pattern 12 so as to obliquely cross the conductor pattern 12. Moreover, the slit 12b has a width S determined to be set in the range from 0.5 to 2.1 mm. The slit 12b, besides being formed linearly as the illustrated, can be formed in a curved line such as a circular-arc.

The four corners chamfered as in the previously described embodiments make the chamfered sections unusable to reduce the area of the conductor pattern mounting a component such as a chip component. This imposes limitation to areas for carrying out wire bonding and for soldering terminals. From this viewpoint, in the arrangement in the embodiments with the ceramic substrate 10 with its original square shape, no chamfered section is provided for the conductor pattern 11 on the top surface side that mounts a component such as a chip component to secure the maximum effective area of the conductor pattern. Since the slit 12b is formed on the bottom surface side of the substrate 10, effective area of the substrate is not reduced. Locations for providing the slits 12b can be determined in the same way as for determining the locations for chamfering the conductor patterns 12 in the previous embodiments.

By the above arrangement, in an assembled state of a module with the insulating substrate 2 mounted on the metal base 1 for heat dissipation and soldered thereto, even though solder cracks C are developed in any of the corners of the soldered section between the conductor pattern 12 and the metal base 1 as shown in FIG. 4, due to thermal stress caused by temperature cycle, propagation of solder cracks C is stopped at the slits 12b. Thus, the cracks C can be prevented from further progressing toward the central region of the substrate. Moreover, by determining the width S of the slit 12b in a narrow range from 0.5 to 2.1 mm, cracks developed at soldered sections at the corner sections of the substrate can be effectively prevented from progressing toward the central region of the substrate like by the chamfered sections in the above-described embodiments with a high heat transfer being secured between the insulating substrate 2 and the metal base 1. The inventors confirmed the effectiveness of the design of the embodiment of FIG. 4 the temperature cycle test.

In addition, the triangular conductor pattern 12c (see FIG. 3B) left outside of each of the slits 12b can be chamfered by rounding the corner section thereof. This can further lessen thermal stress applied to the soldered section by a synergistic effect of providing the slits 12b and chamfering the above corner sections.

In the above-explained embodiments, the ceramic substrate 10 can be formed of materials such as aluminum oxide, aluminum nitride, silicon nitride, and composite ceramic of zirconium-oxide-added aluminum oxide. The material of the conductor pattern is not limited to copper material, but composite material of copper and molybdenum, composite material of copper and copper oxide, aluminum, molybdenum, and composite material of aluminum and silicon carbide can be also used.

Referring to FIGS. 5–9, which illustrate yet another embodiment according to the present invention, the ceramic substrate 10 is composite material of zirconium-oxide-added aluminum oxide or silicon nitride. The conductor patterns 11 and 12 formed on both the top and bottom surfaces of the ceramic substrate 10, respectively, are of copper foils. Here, with the thicknesses of the conductor patterns (copper foils) 11 and 12 taken as t1 and t2, respectively, and thickness of the ceramic substrate 10 taken as t3, the respective thicknesses of t1, t2 and t3 are determined so as to satisfy the relations t1>t3, t2>t3 and t1≧t2. Thus, the insulating substrate 2 is formed with the layer thicknesses of the conductor patterns 11 and 12 made larger than the thickness of the ceramic substrate 10. Moreover, as practical values for products, the respective layer thicknesses t1 and t2 of the conductor patterns 11 and 12 are taken as 0.4 to 0.6 mm and the thickness t3 of the ceramic substrate 10 is determined as being in the range from 0.2 to 0.4 mm.

In the following, the temperature cycle tests carried out by the inventors will be explained in which an insulating substrate with the above arrangement and a related insulating substrate were taken as test samples. Namely, as the test example according to the invention, an assembly was prepared in which an insulating substrate, made by bonding a 0.5 mm thick conductor pattern (copper foils) onto each surface of a 0.25 mm thick ceramic substrate, was soldered to a 4 mm thick base plate of copper with SnPb solder. Moreover, as a test example for comparison, an assembly was prepared in which an insulating substrate, made with a 0.25 mm thick ceramic substrate having a conductor pattern (copper foils) of 0.25 mm thick, the same thickness as that of the substrate, on each surface, was soldered by using SnPb solder to a base plate of copper with a thickness of 4 mm, the same thickness as the above test example. Then, the temperature cycle tests similar to the tests explained in the section of the previous embodiments (temperature cycle condition: −40° C. to 125° C.) were carried out.

According to the results of the temperature cycle tests, in the related insulating substrate with the thickness of the conductor pattern taken as 0.25 mm, the same thickness as that of the ceramic substrate, development of a solder crack was observed at the corner section of the substrate after about 2000 cycles. Compared with this, in the insulating substrate with the thickness of the conductor pattern taken as 0.4 mm, temperature cycles for a time before development of a solder crack became on the order of 3000 cycles. With the thickness of the conductor pattern further brought to 0.5 mm, it was confirmed that the temperature cycles was extended up to 4000 cycles. From the results, it was confirmed that the layer thickness of each of the conductor patterns 11 and 12 determined larger than the thickness of the ceramic substrate 10 extends the number of temperature cycles before developing a solder crack.

In addition, in parallel with the temperature cycle test, the degree of concentration of thermal stress applied to a soldered section was examined. The results also showed that, with the degree of stress concentration on the soldered section taken as 100 for an insulating substrate having conductor pattern with a thickness of 0.25 mm, equal to the thickness of the ceramic substrate, the degree of stress concentration became 93 for the conductor pattern with 0.4 mm thickness. Furthermore, for the conductor pattern with 0.5 mm thickness, the degree of stress concentration was lowered to 88. This shows that the conductor pattern with the thickness thereof set larger than that of the ceramic substrate reduces the degree of stress concentration at the soldered section with an increase in the thickness thereof extending the fatigue life of the soldered section.

Here, for more effectively reducing stress (distortion) created at the soldered section, the difference in coefficient of thermal expansion between the insulating substrate 2 and the metal base 1 for heat dissipation should be the smallest possible. Thus, for proving that the effect of stress reduction by the above arrangement can be reflected on actual products, the inventors carried out following examination. First, since the insulating substrate 2 is a three layered structure with conductor patterns (copper) 11 and 12 bonded onto both the top and bottom surfaces of the ceramic substrate 10, respectively, letting the coefficient of thermal expansion be $\alpha_1$, the longitudinal elastic coefficient be $E_1$ and the thickness be $h_1$ for the ceramic substrate 10, and letting the coefficient of thermal expansion be $\alpha_2$, the longitudinal elastic coefficient be $E_2$ and the thickness be $h_2$ for each of the conductor patterns 11 and 12, an effective coefficient of thermal expansion $\alpha_G$ of the insulating substrate 2 can be expressed by the following expression:

$$\alpha_G = \alpha_1 + (\alpha_2 - \alpha_1)\frac{E_2 h_2}{h_1 E_1 + h_2 E_2}$$

Figure 6:
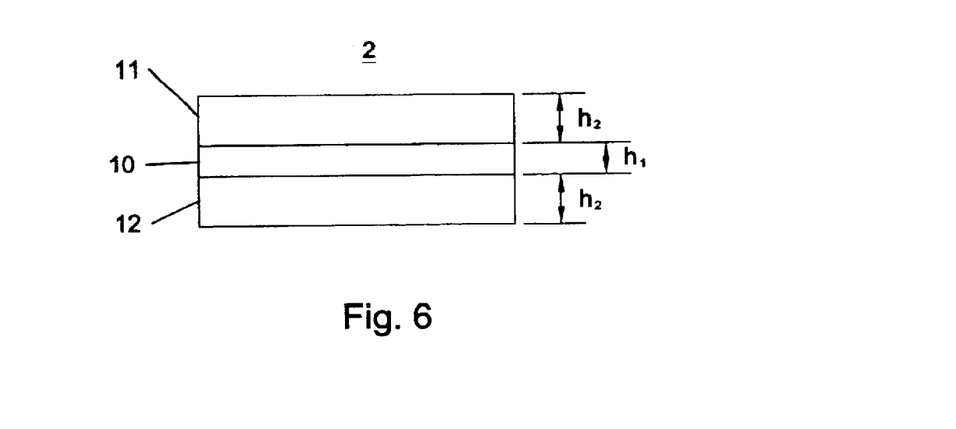
FIG. 6 is a view schematically showing the insulating substrate shown in FIG. 5.

By using the above expression, coefficients of thermal expansion $\alpha_G$ of a substrate model shown in FIG. 6 are calculated out as presented by the following Table 1.

TABLE 1

COEFFICIENTS OF THERMAL EXPANSION OF INSULATING SUBSTRATES

| Ceramic Material | No. | Ceramic $\alpha_1$ (ppm/K) | $E_1$ (GPa) | $h_1$ (mm) | Copper Circuit Pattern $\alpha_2$ (ppm/K) | $E_2$ (GPa) | $h_2$ (mm) | Insulating Substrate $\alpha_G$ (ppm/K) |
|---|---|---|---|---|---|---|---|---|
| Zirconia- | 1 | 7.5 | 360 | 0.25 | 16.5 | 110 | 0.25 | 9.6 |
| added | 2 | | | | | | 0.4 | 10.5 |
| Alumina | 3 | | | | | | 0.5 | 10.9 |
| Silicon | 1 | 4.0 | 300 | 0.25 | 16.5 | 110 | 0.25 | 7.4 |
| Nitride | 2 | | | | | | 0.4 | 8.6 |
| | 3 | | | | | | 0.5 | 9.3 |

Ceramic plate: Coefficient of thermal expansion: $\alpha_1$,
Longitudinal elastic coefficient: $E_1$,
Thickness: $h_1$
Top and bottom copper circuit patterns:
Coefficient of thermal expansion: $\alpha_2$,
Longitudinal elastic coefficient: $E_2$,
Thickness: $h_2$ The above table reveals that, when the material of the ceramic substrate 10 is made of a composite material of alumina with zirconium oxide added thereto and each of the conductor patterns (copper circuit patterns) 11 and 12 is made of a copper foil, and thickness of the ceramic substrate 10 and the thickness of each of the conductor patterns are equal to each other as being 0.25 mm, the coefficient of thermal expansion $\alpha_G$ of the insulation substrate 2 is 9.6. This provides the difference in coefficient of thermal expansion from a copper metal base (coefficient of thermal expansion: 16.5 ppm/K) as becoming 6.9. Compared with this, when the thickness of the ceramic substrate is taken as 0.25 mm and the layer thickness of each of the conductor patterns in the insulating substrate is increased to 0.4 mm, the difference in coefficient of thermal expansion between the insulating substrate and the conductor pattern is reduced to 6.0. Increasing the thickness of the conductor pattern to 0.5 mm reduces the difference in coefficient of thermal expansion to 5.6.

In the insulating substrate 2, due to the difference in coefficient of thermal expansion between the ceramic substrate 10 and each of the conductor patterns 11 and 12, thermal stress is created near the joint interface between the ceramic substrate and the conductor pattern when a temperature cycle is applied as described before. On the top surface side of the substrate, the stress acts as a compressive stress in a temperature raising process in a temperature cycle and as a tensile stress in a temperature dropping process. The tensile stress exceeding the tensile strength of the ceramic will cause possible breakage of the ceramic substrate. In this case, from an analysis of thermal stress, it is known that an increase in the thickness of the conductor pattern will increase the tensile stress in the ceramic substrate.

Therefore, regarding an insulating substrate using a ceramic material with a relatively small tensile strength such as aluminum nitride, the thickness of a conductor pattern is normally set equal to or less than 0.3 mm for making created tensile stress brought to within the tensile strength of the ceramic. Compared with this, by using the composite ceramic of aluminum oxide with zirconium added thereto or silicon nitride ceramic, having tensile strength three times or more compared with that of aluminum nitride, as a material for the ceramic substrate, the tensile stress applied to the ceramic is held below the tensile strength of the ceramic although the stress increases with an increase in the thickness of the conductor pattern. Therefore, no breakage of ceramic is caused. The above composite ceramic has been previously proposed in Japanese Patent No. 2,883,787 and Japanese Patent No. 3,176,815.

Figure 9:
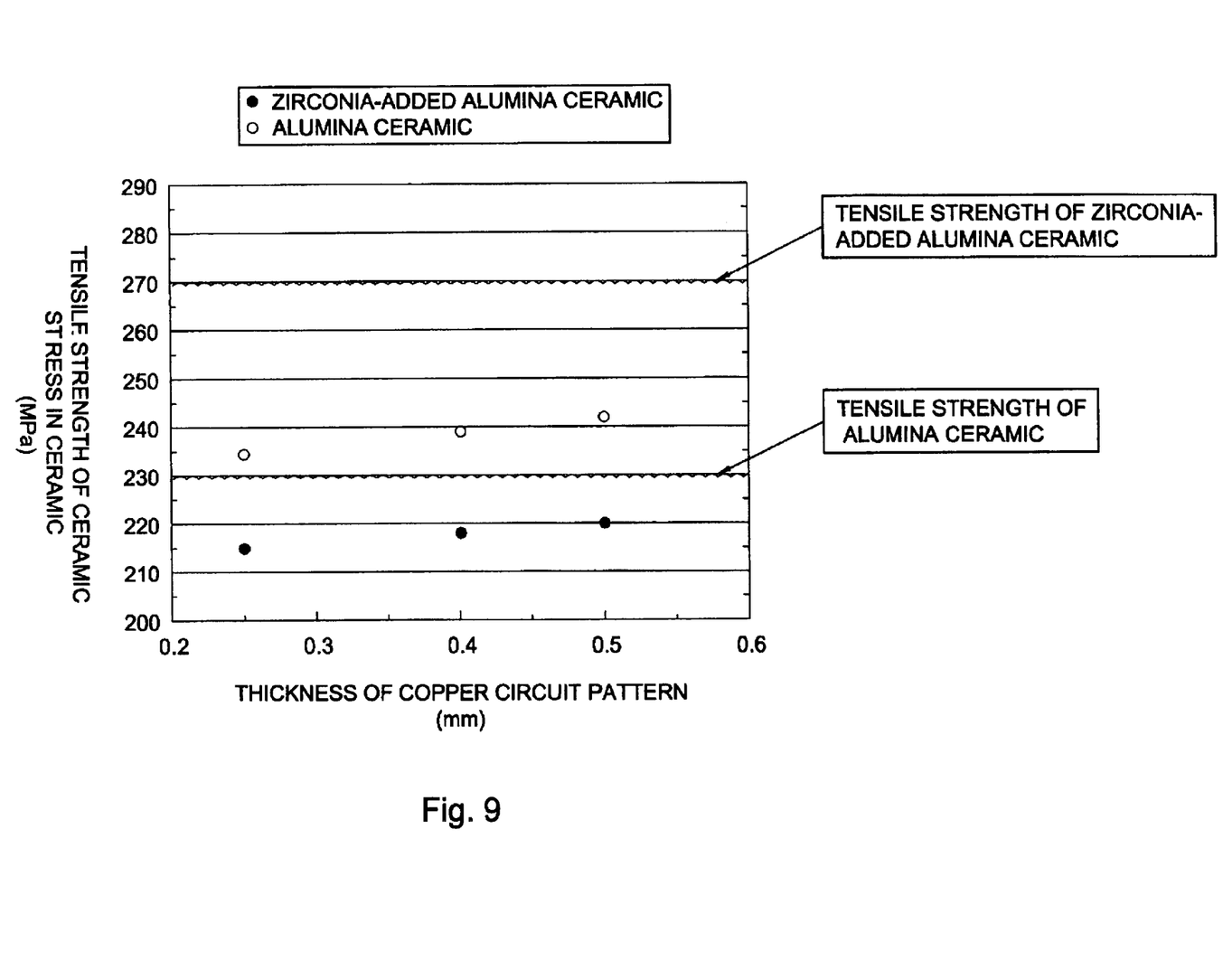
FIG. 9 is a characteristic diagram showing the relationships between the thicknesses of copper circuit patterns and thermal stresses created in ceramic substrates for explaining the embodiment of FIG. 5.

In FIG. 9, the relationships between the thickness of copper circuit patterns (conductor patterns) each formed on and bonded to each surface of ceramic and tensile stresses applied to the ceramic are shown about a general alumina ceramic (0.25 mm thickness) and a high strength zirconia-added alumina ceramic (0.25 mm thickness). This shows that, in the case of the alumina ceramic with copper bonded thereto, the tensile stress therein exceeds the tensile strength of the ceramic to cause breakage of the ceramic at several hundreds of cycles in an actual temperature cycle. Compared with this, in the case of the zirconia-added alumina ceramic with copper bonded thereto, the tensile stress therein is below the tensile strength of the ceramic to cause no breakage of the ceramic even at several thousands of cycles in an actual temperature cycle.

Furthermore, by making the thickness of each of the conductor patterns 11 and 12 larger than the thickness of the ceramic substrate 10, the following effects can be also obtained.

Figure 7:
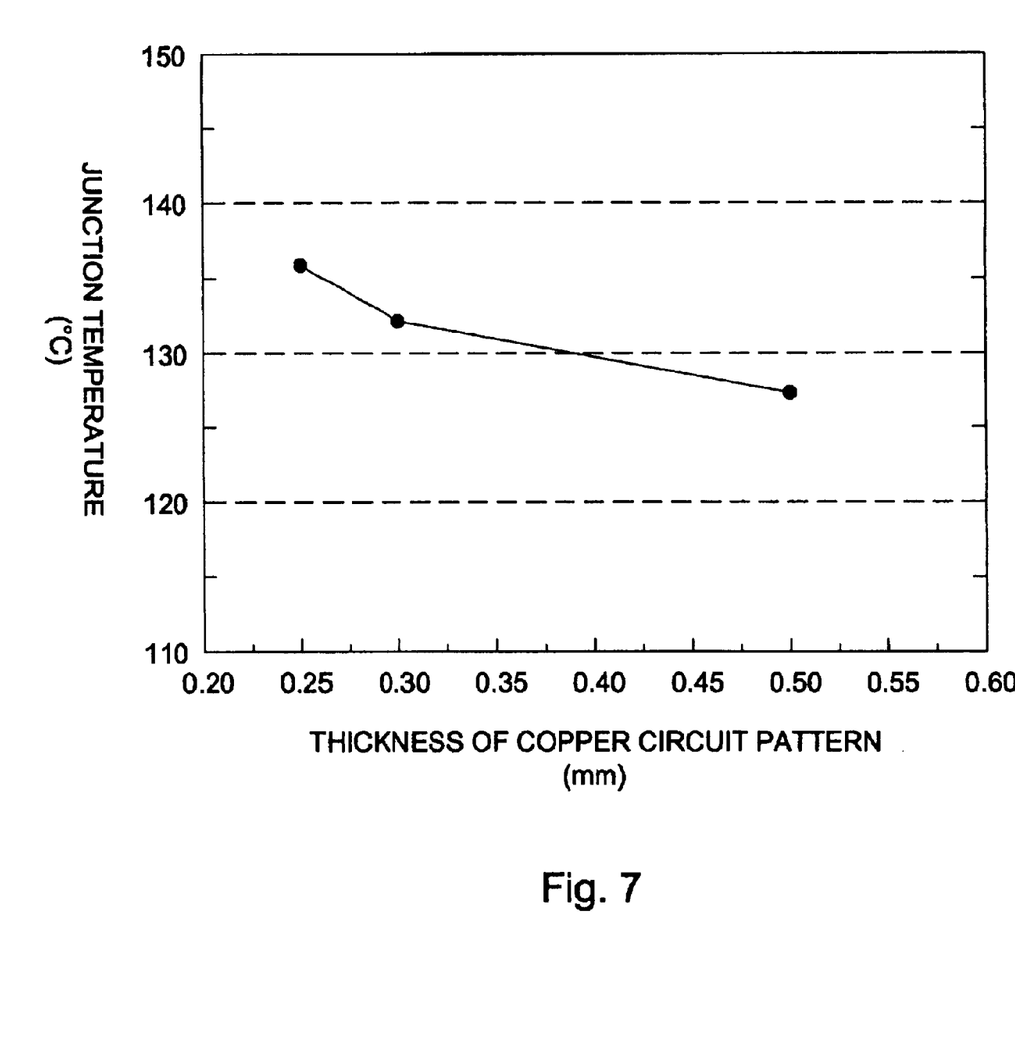
FIG. 7 is a characteristic diagram showing the relationship between the thickness of the copper circuit pattern and the temperature of the junction of an energized semiconductor element mounted on the insulating substrate for explaining the embodiment of FIG. 5.

(1) Temperature rise in the junction of the silicon chip (power semiconductor element) 3 (see FIG. 10) mounted on the insulating substrate can be held low. Namely, this is shown in FIG. 7, which is a characteristic diagram showing the relationship between the thickness of a copper circuit pattern (conductor pattern 11) of an IGBT (silicon chip 3) and the junction temperature of the silicon chip. The relationship was measured under an actual operating condition with a power loss of 240 W loaded on a corrector of the IGBT. As is apparent from the characteristic diagram, with an increase in the thickness of the copper circuit pattern from 0.25 mm to 0.5 mm, a temperature rise of the chip is reduced on the order of 10° C. to improve reliability.

Figure 8A:
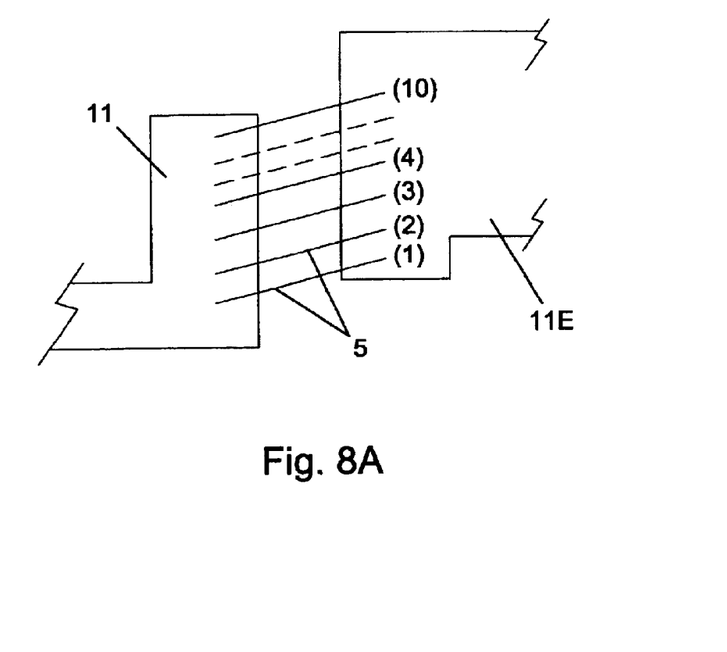
FIG. 8A is a view showing an arrangement of wires with the wires bonded onto the copper circuit pattern for the embodiment of FIG. 5.
Figure 8B:
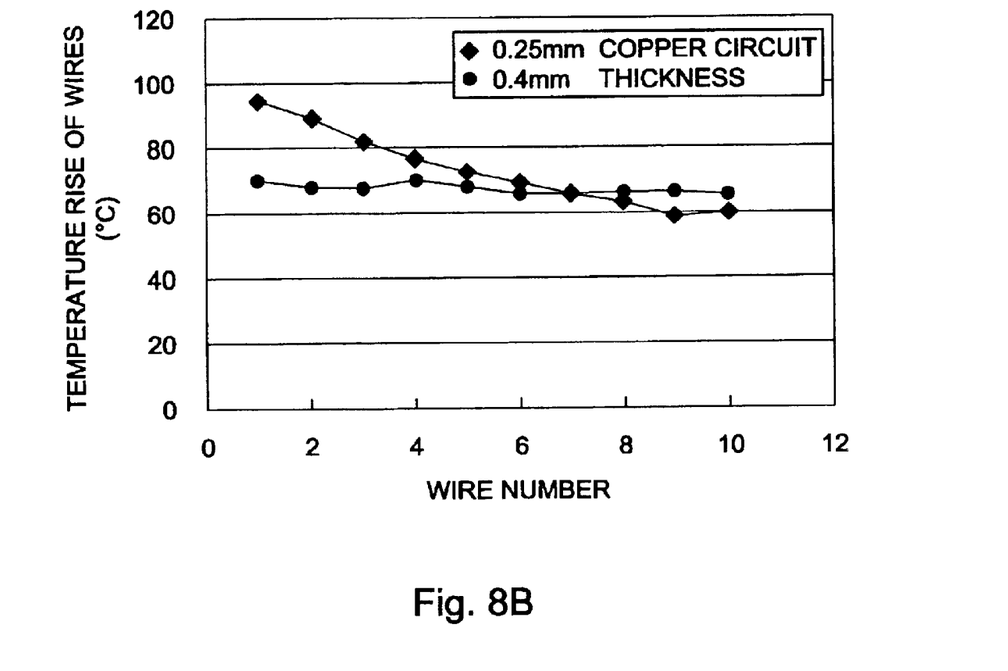
FIG. 8B is a characteristic diagram showing the relationships between the wires shown in FIG. 8A and raised temperatures of the wires about different thicknesses of the copper circuit patterns in the insulating substrate.

(2) Temperature rise and variation in the temperature rise can be held low in a plurality of aluminum wires bonded to the copper circuit pattern (conductor pattern 11) in the insulating substrate. FIG. 8A illustrates a measuring example prepared for measuring the temperature rise in bonding wires associated with the energization thereof. To a conductor pattern 11 (copper circuit pattern) formed on and bonded to the insulating substrate, a total of ten aluminum wires 5 (wire numbers from (1) to (10)) are bonded parallel with one another between the conductor pattern 11 and a collector electrode 11E. FIG. 8B illustrates a characteristic diagram showing the relationship between the temperature rise of the aluminum wires and the thicknesses of the copper circuit pattern. The temperature rise of the aluminum wires were measured and plotted for each of the wires with the wire numbers from (1) to (10) when a dc current of 600 A is supplied for 0.5 sec to the collector electrode 11E of the above measuring example.

As is understood from the characteristic diagram, the raised temperature of the aluminum wires 5 varied depending on the positions of the wires with the wire numbers from (1) to (10). When the thickness of the copper circuit pattern is 0.25 mm, the temperature difference between the temperature of 95° C. of the wire number (1) with the temperature rise becoming the maximum and the temperature of 59° C. of the wire number (10) with the temperature becoming the minimum, the temperature rise becomes as much as 36° C.

Compared with this, with an increase in the thickness of the copper circuit pattern up to 0.4 mm, even the maximum raised temperature of the aluminum wire is given as 70° C. (wire number (1)) even at the maximum to reduce the temperature difference from the temperature of the aluminum wire with the minimum raised temperature (wire number (10)) down to only 6° C., the variation in the wire temperatures is lessened.

By thickening the conductor pattern 11 bonded to and formed on the ceramic substrate, the temperature rise in wires, bonded onto the conductor pattern 11 in distribution, is made uniform. This is due to reduction in electric resistance by thickening the conductor pattern 11, which eliminates nonuniformity in resistance that is dependent on positions of wires bonded to the conductor pattern 11. This prevents current supplied to the bonding wires from becoming unbalanced.

Moreover, since the thickened conductor pattern 11 reduces electric resistance thereof, the width of wiring of a circuit pattern section (not shown) can be narrowed. Narrowed width of the wiring can reduce the area of the ceramic substrate to make it possible to downsize the semiconductor device.

Therefore, by forming an insulating substrate as further another embodiment of the present invention with the last embodiment combined with the chamfering and the slit at the corner sections of the substrate described in the previous embodiments the reliability and life can be further improved.

In each of the above-described embodiments, the metal base, soldered to the conductor pattern formed on the bottom surface side of the above insulating substrate, functions as a heat dissipating material. Thus, the metal base is provided as a plate-like metal, for which copper, molybdenum, aluminum, or composite material of aluminum and silicon carbide, for example, is processed in plate-like. From the view point of ability to be joined by solder to the conductor pattern and ability to transfer heat, copper is suited for the metal base. For further improving ability to be joined by solder, the metal base can be used with the surface thereof processed by plating.

Alternatively, the above metal base can be a metal radiating fin as a heat dissipation component. Moreover, when the above plate-like metal is used as the above metal base, by further joining the radiating fin, more heat dissipation effect can be obtained.

As described above, a semiconductor device using an insulating substrate according to the present invention exhibits the following effects.

(1) By adopting any one of the arrangements according to the aspects of the present invention where a chamfered section is formed at each of four corners of the ceramic substrate, or a chamfered section or a slit is formed at each of four corners of the conductor pattern, thermal stress created in the soldered section due to the thermal cycling is relaxed to make it possible to extend the life before solder cracks are developed and to further inhibit growth of the cracks.

(2) By adopting the arrangement according to the another aspect of the present invention where the thickness of the conductor pattern is made larger than the thickness of the ceramic substrate, the temperature rise of components mounted on the substrate such as the chip component and electric resistance of the circuit section can be reduced together with improvement in fatigue life of the soldered section.

(3) Thus, the semiconductor device can be improved in reliability and made to have a long life.

While the invention has been particularly shown and described with reference to preferred embodiments thereof, it will be understood by those skilled in the art that the foregoing and other changes in form and details can be made therein without departing from the spirit and scope of the invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP 2002-235888, in its entirety, including the drawings, claims, and the specification thereof, is incorporated herein by reference.

What is claimed is:

1. A semiconductor device comprising:

an insulating substrate comprising a square or rectangular ceramic substrate, a top conductor pattern formed on and bonded to a top surface of the ceramic substrate, and a bottom conductor pattern formed on and bonded to a bottom surface of the ceramic substrate;

a heat developing semiconductor component mounted on the top conductor pattern; and a metal base mounted in contact with the bottom conductor pattern, wherein the top conductor pattern and the heat developing semiconductor component are joined with a solder, wherein the bottom conductor pattern and the metal base are also joined with a solder, wherein the insulating substrate has means for relaxing thermal stress concentration created in the solder due to thermal cycling, and wherein the thermal stress concentration relaxing means comprises a chamfer at each of four corners of the ceramic substrate, with a chamfered dimension ranging from to 2 mm to 10 mm, the chamfered dimension being a distance along a side thereof from a corner thereof to a chamfered part an the side thereof.

2. A semiconductor device comprising:

an insulating substrate comprising a square or rectangular ceramic substrate, a top conductor pattern formed on and bonded to a top surface of the ceramic substrate, and a bottom conductor pattern formed on and bonded to a bottom surface of the ceramic substrate;

a heat developing semiconductor component mounted on the top conductor pattern; and a metal base mounted in contact with the bottom conductor pattern, wherein the top conductor pattern and the heat developing semiconductor component are joined with a solder;

wherein the bottom conductor pattern and the metal base are also joined with a solder, wherein the insulating substrate has means for relaxing thermal stress concentration created in the solder due to thermal cycling, and wherein the thermal stress concentration relaxing means comprises four chamfers at the bottom conductor pattern, one at each of four corners thereof, with a chamfered dimension ranging from 2 mm to 10 mm, the chamfered dimension being a distance along a side of the bottom conductor pattern from a corner thereof to a chamfered part on the side thereof.

3. A semiconductor device comprising:

an insulating substrate comprising a square or rectangular ceramic substrate, a top conductor pattern formed on and bonded to a top surface of the ceramic substrate, and a bottom conductor pattern formed on and bonded to a bottom surface of the ceramic substrate;

a heat developing semiconductor component mounted on the top conductor pattern; and a metal base mounted in contact with the bottom conductor pattern, wherein the top conductor pattern and the heat developing semiconductor component are joined with a solder, wherein the bottom conductor pattern and the metal base are also joined with a solder, wherein the insulating substrate has means for relaxing thermal stress concentration created in the solder due to thermal cycling, and wherein the thermal stress concentration relaxing means comprises four slits formed across the bottom conductor pattern, one at each of four corners thereof.

4. A semiconductor device according to claim 3, wherein each of the slits is provided from a position on a side of the bottom conductor pattern at a distance ranging from 2 mm to 10 mm from a respective corner thereof.

5. A semiconductor device according to claim 4, wherein a width of the slit ranges from 0.5 mm to 2.1 mm.

6. A semiconductor device comprising:

an insulating substrate comprising a square or rectangular ceramic substrate, a top conductor pattern formed on and bonded to a top surface of the ceramic substrate, and a bottom conductor pattern formed on and bonded to a bottom surface of the ceramic substrate;

a heat developing semiconductor component mounted on the top conductor pattern; and a metal base mounted in contact with the bottom conductor pattern, wherein the top conductor pattern and the heat developing semiconductor component are joined with a solder, wherein the bottom conductor pattern and the metal base are also joined with a solder, wherein the insulating substrate has means for relaxing thermal stress concentration created in the solder due to thermal cycling, and wherein the thermal stress concentration relaxing means comprises each of the top and bottom conductor patterns having a larger thickness than the ceramic substrate.

7. A semiconductor device according to claim 6, wherein the ceramic substrate has a thickness ranging from 0.2 mm to 0.4 mm, and each of the top and bottom conduct patterns has a thickness ranging from 0.4 mm to 0.6 mm.

8. A semiconductor device according to claim 6, wherein the ceramic substrate has a chamfer at each of four corners thereof, with a chamfered dimension ranging from 2 mm to 10 mm, the chamfered dimension being a distance along a side of the ceramic substrate from a corner thereof to a chamfered part on the side thereof.

9. A semiconductor device according to claim 6, wherein the bottom conductor pattern has four chamfers, one at each of four corners thereof, with a chamfered dimension ranging from 2 mm to 10 mm, the chamfered dimension being a distance along a side of the bottom conductor pattern from a corner thereof to a chamfered part on the side thereof.

10. A semiconductor device as claimed in claim 6, wherein the bottom conductor pattern four slits, one at each of four corners thereof.

11. A semiconductor device according to claim 10, wherein each of the slits is provided from a position on a side of the bottom conductor pattern at a distance ranging from 2 mm to 10 mm from a respective corner thereof.

12. A semiconductor device according to claim 11, wherein a width of the slit ranges from 0.5 mm to 2.1 mm.

13. A method of relaxing thermal stress concentration in a semiconductor device having an insulating substrate comprising a square or rectangular ceramic substrate, a top conductor pattern formed on and bonded to a top surface of the ceramic substrate, and a bottom conductor pattern formed on and bonded to a bottom surface of the ceramic substrate, a heat developing semiconductor component mounted on the top conductor pattern, and metal base mounted in contact with the bottom conductor pattern, wherein the top conductor pattern and the heat developing semiconductor component are joined with a solder, and wherein the bottom conductor pattern and the metal base are also joined with a solder, the method comprising the steps of:

at least one of chamfering at each of four corners of the ceramic substrate, with a chamfered dimension ranging from 2 mm to 10 mm, the chamfered dimension being a distance along a side thereof from a corner thereof to a chamfered part on the side thereof; chamfering four chamfers at the bottom conductor pattern, one at each of four corners thereof, with a chamfered dimension ranging from 2 mm to 10 mm, the chamfered dimension being a distance along a side of the bottom conductor pattern from a corner thereof to a chamfered part on the side thereof; forming four slits formed across the bottom conductor pattern, one at each of four corners thereof; and forming each of the top and bottom conductor patterns with a larger thickness than the ceramic substrate; and mounting the metal base on the bottom conductor pattern.

* * * * *